(12) United States Patent
Tokunaga et al.

(10) Patent No.: US 12,437,968 B2
(45) Date of Patent: Oct. 7, 2025

(54) PLASMA PROCESSING APPARATUS AND PLASMA PROCESSING METHOD

(71) Applicant: Hitachi High-Tech Corporation, Tokyo (JP)

(72) Inventors: Takayuki Tokunaga, Tokyo (JP); Mitsuhiro Jomura, Tokyo (JP); Michikazu Morimoto, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 18 days.

(21) Appl. No.: 17/435,147

(22) PCT Filed: Sep. 2, 2020

(86) PCT No.: PCT/JP2020/033301
§ 371 (c)(1),
(2) Date: Aug. 31, 2021

(87) PCT Pub. No.: WO2022/049677
PCT Pub. Date: Mar. 10, 2022

(65) Prior Publication Data
US 2023/0187174 A1 Jun. 15, 2023

(51) Int. Cl.
*H01J 37/32* (2006.01)
*H01L 21/3065* (2006.01)

(52) U.S. Cl.
CPC .... *H01J 37/32165* (2013.01); *H01L 21/3065* (2013.01); *H01J 37/32816* (2013.01); *H01J 2237/182* (2013.01); *H01J 2237/334* (2013.01)

(58) Field of Classification Search
CPC .......... H01J 2237/182; H01J 2237/334; H01J 37/32082; H01J 37/32091;

(Continued)

(56) References Cited

U.S. PATENT DOCUMENTS 7,884,025 B2  2/2011  Collins et al.
8,394,720 B2  3/2013  Fujihara
(Continued)

FOREIGN PATENT DOCUMENTS

CN   1883036 A    12/2006
JP   H10150025 A   6/1998
(Continued)

OTHER PUBLICATIONS

Office Action mailed Feb. 5, 2024 in Korean Application No. 10-2021-7027243.
(Continued)

*Primary Examiner* — Ibrahime A Abraham
*Assistant Examiner* — Joe E Mills, Jr.
(74) *Attorney, Agent, or Firm* — Miles & Stockbridge, P.C.

(57) ABSTRACT

A plasma processing apparatus including a processing chamber; a first radio frequency power supply configured to supply, to a sample stage on which the sample is placed, a first radio frequency power; a second radio frequency power supply configured to supply, to the sample stage, a second radio frequency power having a frequency higher than a frequency of the first radio frequency power; and a control device configured to control the first radio frequency power supply and the second radio frequency power supply such that the supply of one radio frequency power is stopped while the other radio frequency power is supplied, in which the frequency of the first radio frequency power and the frequency of the second radio frequency power are defined based on a half-value width of a peak value of an ion energy distribution with respect to the frequency.

11 Claims, 9 Drawing Sheets

(58) Field of Classification Search
CPC .......... H01J 37/32146; H01J 37/32165; H01J 37/32174; H01J 37/32183; H01J 37/32192; H01J 37/32816; H01L 21/3065; H05H 1/46
See application file for complete search history.

(56) References Cited

U.S. PATENT DOCUMENTS

| | | |
|---|---|---|
| 8,545,671 B2 | 10/2013 | Honda |
| 2002/0066537 A1 | 6/2002 | Ogino et al. |
| 2003/0000646 A1 | 1/2003 | Ogino et al. |
| 2005/0112891 A1 | 5/2005 | Johnson et al. |
| 2006/0266735 A1 | 11/2006 | Shannon et al. |
| 2007/0175856 A1 | 8/2007 | Johnson et al. |
| 2008/0050926 A1 | 2/2008 | Nakagawa |
| 2008/0178805 A1 | 7/2008 | Paterson et al. |
| 2008/0190893 A1 | 8/2008 | Mori et al. |
| 2008/0193673 A1 | 8/2008 | Paterson et al. |
| 2009/0078678 A1 | 3/2009 | Kojima et al. |
| 2011/0220609 A1 | 9/2011 | Yaegashi et al. |
| 2013/0228550 A1* | 9/2013 | Mori ............... H03H 7/40 216/61 |
| 2013/0295774 A1 | 11/2013 | Shimizu et al. |
| 2014/0102638 A1 | 4/2014 | Ooya et al. |
| 2014/0116621 A1 | 5/2014 | Mori et al. |
| 2018/0047573 A1 | 2/2018 | Tanaka et al. |
| 2018/0366335 A1 | 12/2018 | Tanaka et al. |
| 2021/0398774 A1 | 12/2021 | Liu et al. |

FOREIGN PATENT DOCUMENTS

| | | |
|---|---|---|
| JP | H11-26189 A | 1/1999 |
| JP | 2000150196 A | 5/2000 |
| JP | 2005191056 A | 7/2005 |
| JP | 2007509506 A | 4/2007 |
| JP | 2008053507 A | 3/2008 |
| JP | 2008244429 A | 10/2008 |
| JP | 2010512031 A | 4/2010 |
| JP | 2011228436 A | 11/2011 |
| JP | 2013175784 A | 9/2013 |
| JP | 2015216384 A | 12/2015 |
| KR | 10-2007-0102623 A | 10/2007 |
| TW | 200841775 A | 10/2008 |
| TW | 201027281 A | 7/2010 |
| TW | 201131648 A | 9/2011 |
| TW | 201207932 A | 2/2012 |
| TW | 202017043 A | 5/2020 |
| WO | 2017126184 A1 | 7/2017 |
| WO | 2020082874 A1 | 4/2020 |

OTHER PUBLICATIONS

Office Action mailed May 5, 2022 in Taiwanese Application No. 110125837.
Office Action mailed Feb. 2, 2023 in U.S. Appl. No. 16/111,853.
Written Opinion mailed Nov. 2, 2020, in International Application No. PCT/JP2020/033301.
Search Report mailed Nov. 2, 2020, in International Application No. PCT/JP2020/033301.
Search Report mailed Dec. 27, 2016 in International Application No. PCT/JP2016/082508.
Office Action mailed Nov. 7, 2017 in Taiwan Application No. 106101699.
Office Action mailed Oct. 30, 2018 in Japanese Application No. 2017-562440.

* cited by examiner

| | CENTRAL PORTION OF WAFER | END PORTION OF WAFER |
|---|---|---|
| SHAPE AFTER PROCESSING ACCORDING TO PRESENT INVENTION | | |

PLASMA PROCESSING APPARATUS AND PLASMA PROCESSING METHOD

TECHNICAL FIELD

The present invention relates to a plasma processing apparatus and a plasma processing method.

BACKGROUND ART

In a manufacturing process of a semiconductor device, it is required to achieve miniaturization and integration of components included in the semiconductor device. For example, nanoscale of a structure is further promoted in an integrated circuit and a nano-electromechanical system.

Generally, in the manufacturing process of the semiconductor device, a lithography technique is used to form micropatterns. In the above technique, a pattern of a device structure is applied on a resist layer, and a substrate exposed by the pattern on the resist layer is selectively removed by etching. In a subsequent processing step, the integrated circuit can be formed by depositing other materials in an etched region.

For example, a plasma etching technique is used to manufacture a metal-oxide-semiconductor field-effect-transistor (MOS FET) device or the like used in an electronic device or the like. In an etching processing of a semiconductor substrate (hereinafter abbreviated as "substrate") using plasma etching, uniformity of the processing in a plane of the substrate is required in order to improve a yield on the substrate, and a demand for verticality of an etching shape increases as miniaturization of a device progresses. In order to make the etching shape uniformly vertical in a plane, it is important to control ions incident on the substrate from plasma.

As a method of controlling the ions incident on the substrate from the plasma, PTL 1 discloses a technique in which a plurality of bias applying devices for drawing ions from plasma onto a wafer are provided, and energy of the ions incident on the wafer and a distribution thereof are independently changed by controlling a bias power ratio (mixing ratio) of a plurality of frequencies.

CITATION LIST

Patent Literature

PTL 1: JP-A-2008-244429
PTL 2: WO 2017/126184

SUMMARY OF INVENTION

Technical Problem

The technique in the related art described in PTL 1 described above is not sufficiently considered in terms of controllability of the ions for coping with further miniaturization of elements. That is, a bias power for giving incident energy to the ions for the ions to be incident on the substrate is obtained by superimposing (mixing) a radio frequency power and a low frequency power and changing a mixing ratio thereof. Therefore, a maximum potential difference (hereinafter, referred to as "Vpp") of a voltage waveform of the superimposed combined radio frequency power applied to a sample stage has to be prevented from exceeding a limit value in hardware. Therefore, Vpp of each radio frequency power is used in a range smaller than an allowable maximum value, and there is a possibility that ion control cannot be sufficiently performed because each radio frequency power cannot exhibit up to a maximum output.

Further, since a waveform of the radio frequency power obtained by combining different frequencies changes in a complicated manner, impedance matching may be difficult. There is also a possibility that a problem of crosstalk in which electrical signals are mixed with each other occurs.

As a method for solving the problems, PTL 2 discloses a method of switching and applying bias powers having a plurality of different frequencies to be applied to a sample stage. In the above method, by changing a switching time ratio, it is possible to solve the problems that may occur in PTL 1 and to control the energy of the ions and the distribution thereof by using different frequencies.

Figure 3:
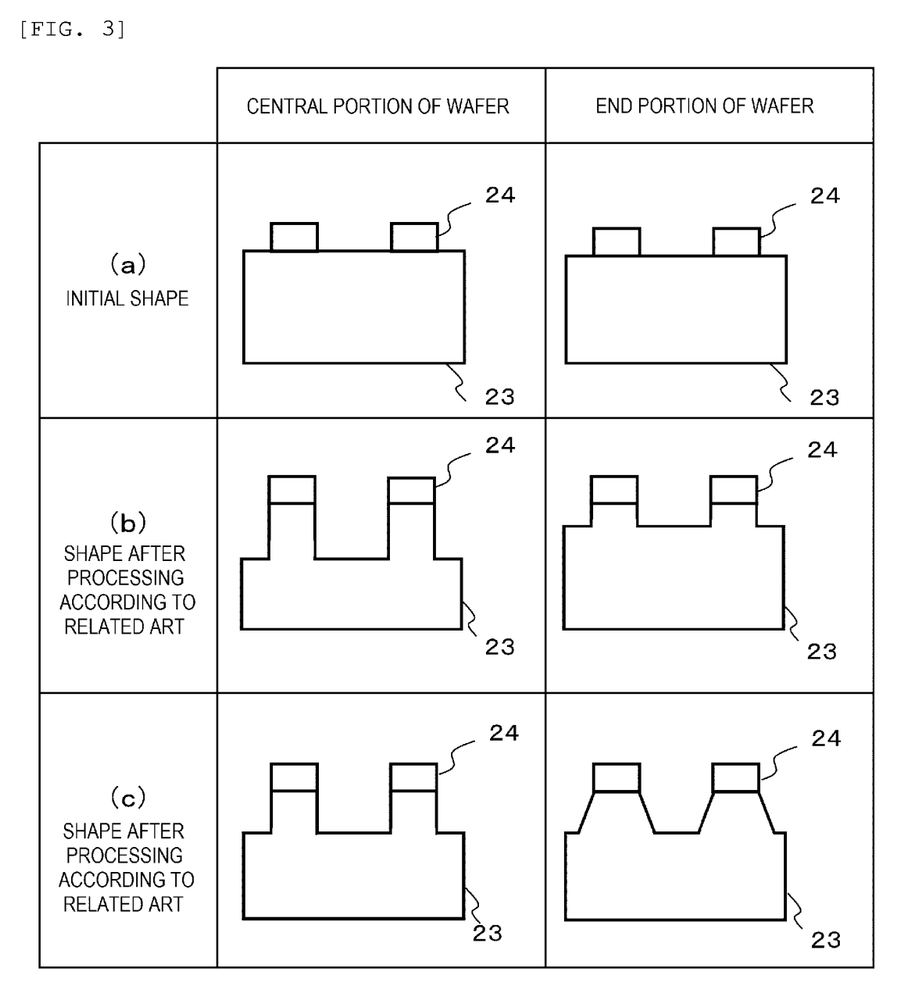
FIG. 3 is a diagram showing etching shapes when a wafer is etched by a technique in the related art.

However, although in-plane uniformity of an etching rate on a blanket wafer can be controlled by using the method in PTL 2, since an ion energy distribution change due to a frequency change is not considered, there remains a problem in control of in-plane uniformity of an etching shape. An example of the problem will be specifically described with reference to FIG. 3. (b) in FIG. 3 shows a result of etching an initial shape of (a) in FIG. 3 only by applying a single bias power, and (c) in FIG. 3 shows a result of etching by using a condition that an etching rate distribution is flat in the method in PTL 2. Here, etching is performed on a wafer as a target in which a $SiO_2$ film 24 is laminated on a Si substrate 23.

According to the result of etching by the single bias power, as shown in (b) in FIG. 3, although an etching shape is a vertical shape in both a central portion of the wafer and an end portion of the wafer, a shape depth is different between the central portion of the wafer and the end portion of the wafer. In contrast, according to the result of etching under a condition that the etching rate distribution is flat in the method in PTL 2, as shown in (c) in FIG. 3, although the etching shape is different between the central portion of the wafer and the end portion of the wafer, shape depths are the same. Therefore, even when bias powers having different frequencies are applied, there is a further problem in uniformizing the etching shape in a plane of the wafer.

In order to solve the problems described above, an object of the invention is to provide a plasma processing apparatus and a plasma processing method capable of obtaining a desired etching shape in the plane of the wafer.

Solution to Problem

In order to solve the above problem, one plasma processing apparatus according to the invention is achieved by including:

- a processing chamber in which a sample is plasma-processed;
- a radio frequency power supply configured to supply a radio frequency power for generating plasma;
- a first radio frequency power supply configured to supply, to a sample stage on which the sample is placed, a first radio frequency power;
- a second radio frequency power supply configured to supply, to the sample stage, a second radio frequency power having a frequency higher than a frequency of the first radio frequency power; and
- a control device configured to control the first radio frequency power supply and the second radio frequency power supply such that the supply of one radio frequency power is stopped while the other radio frequency power is supplied, in which the frequency of the first radio frequency power and the frequency of the second radio frequency power are defined based on a full width at half maximum of a peak value of an ion energy distribution with respect to the frequency.

One typical plasma processing method according to the invention, which uses a plasma processing apparatus including a processing chamber in which a sample is plasma-processed, a radio frequency power supply configured to supply a radio frequency power for generating plasma, a first radio frequency power supply configured to supply, to a sample stage on which the sample is placed, a first radio frequency power, and a second radio frequency power supply configured to supply, to the sample stage, a second radio frequency power having a frequency higher than a frequency of the first radio frequency power, is achieved by including:
- a step of controlling the first radio frequency power supply and the second radio frequency power supply such that the supply of one radio frequency power is stopped while the other radio frequency power is supplied;
- a step of setting the pressure of the plasma processing to a pressure at which an mean free path of ions is longer than a sheath thickness on the sample; and
- a step of defining the frequency of the first radio frequency power and the frequency of the second radio frequency power based on a full width at half maximum of a peak value of an ion energy distribution with respect to the frequency.

Advantageous Effect

According to the invention, the plasma processing apparatus and the plasma processing method capable of obtaining the desired etching shape in the plane of the wafer can be provided.

Problems, configurations, and effects other than those described above will be apparent from the following description of the embodiment.

DESCRIPTION OF EMBODIMENTS

In an embodiment described below, by utilizing a fact that an incident energy distribution of ions from plasma to a wafer changes depending on a frequency of a bias power, controllability of an ion incidence on the wafer is further improved, and in-plane uniformity of an etching processing, that is, in-plane uniformity of an etching rate and in-plane uniformity of an etching shape of the wafer corresponding to a semiconductor device structure to be miniaturized can be obtained.

In addition to plasma generation, a bias voltage applied to the wafer is independently controlled, that is, in addition to control of a radio frequency power for generating the plasma, control of a radio frequency power applied to a sample stage for giving energy to ions incident on the wafer is independently performed. Further, a plurality of bias power supplies having different frequencies are used to control the radio frequency power to be applied to the sample stage, and bias powers having different frequencies are switched and supplied for each step.

By providing a single supply time zone of the bias powers having different frequencies by switching in each step, it is possible to set the bias power supply of each frequency up to a maximum allowable value of a bias power supply 205 which can be applied to the sample stage at the time of processing, and the controllability of the ion incidence on the wafer is further improved. Hereinafter, the embodiment of the invention will be described.

Figure 1:
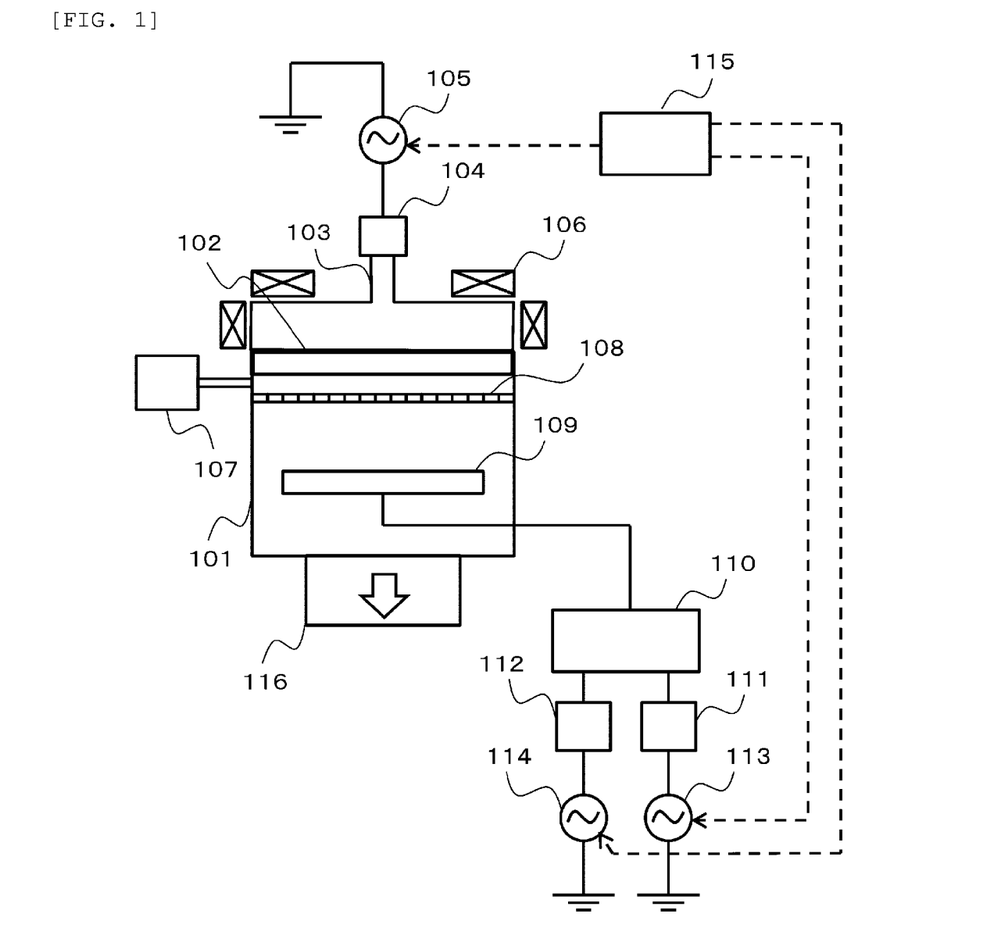
FIG. 1 is a schematic configuration diagram showing a plasma processing apparatus according to the present embodiment.
Figure 2:
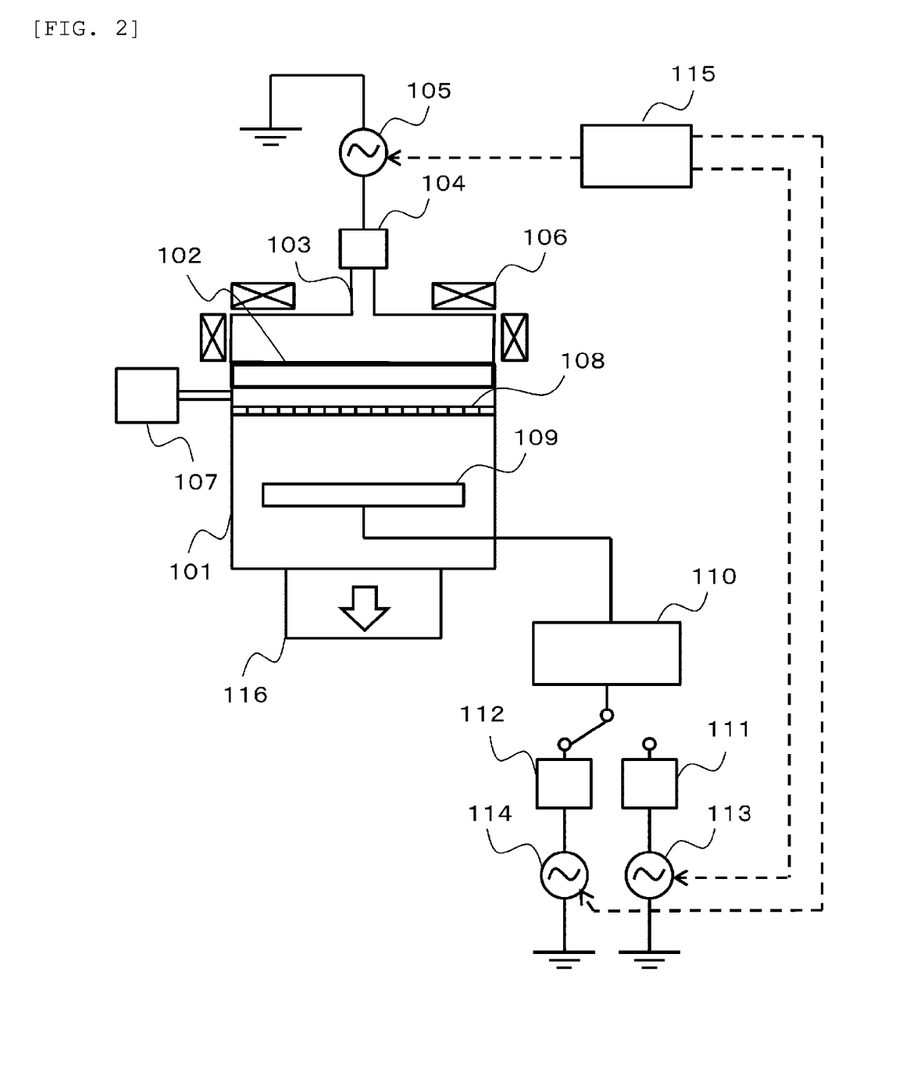
FIG. 2 is a schematic configuration diagram showing the plasma processing apparatus according to the present embodiment.

FIG. 1 is a schematic configuration diagram showing a plasma processing apparatus s according to the present embodiment. FIG. 2 is another schematic configuration diagram showing the plasma processing apparatus according to the embodiment. The same components in FIGS. 1 and 2 are denoted by the same reference numerals. In the present embodiment, a vacuum container 101 constituting a processing chamber is a cylindrical container made of a conductive material such as aluminum, and is electrically grounded. An upper opening of the vacuum container 101 is sealed by a ceiling plate 102 made of a material through which electromagnetic waves can pass, for example, quartz. A vacuum evacuation device that reduces a pressure and evacuates an inside of the vacuum container 101 to a predetermined pressure is connected to a center of a lower portion of the vacuum container 101. A waveguide tube 103 is provided above the ceiling plate 102 in a manner of covering the ceiling plate 102, and a radio frequency power supply for plasma generation (hereinafter referred to as a "radio frequency power supply" or a "plasma power supply 105") is connected to the waveguide tube 103 via an integrator 104.

In this case, the plasma power supply 105 oscillates a microwave of 2.45 GHZ. The oscillated microwave propagates through the waveguide tube 103 and is introduced into the vacuum container 101 via the ceiling plate 102. A solenoid coil (magnetic field generating device) 106 for forming a magnetic field in the vacuum container 101 is wound around an outer side of the vacuum container 101. A shower plate 108 is provided in an upper portion of the vacuum container 101 below the ceiling plate 102, and a gas supply device 107 is connected between the ceiling plate 102 and the shower plate 108 of the vacuum container 101.

A processing gas is supplied from the gas supply device 107 into a space between the ceiling plate 102 and the shower plate 108, and is supplied, via the shower plate 108, into a processing chamber formed in the vacuum container 101. A sample stage 109 is provided in the vacuum container 101, and the wafer (sample) is loaded from a wafer loading port (not shown) and arranged and held on the sample stage 109.

A first bias power supply (hereinafter, referred to as a "first radio frequency power supply" or a "first bias power supply 113") having a frequency of 800 KHz and a second bias power supply (hereinafter, referred to as a "second radio frequency power supply" or a "second bias power supply 114") having a frequency of 400 KHz, which are radio frequency power supplies for bias having a plurality of, in this case, two different frequencies, are electrically connected in parallel to the sample stage 109 via a filter 110 and first and second integrators 111 and 112, respectively. The second radio frequency power supply can supply a second radio frequency power having a frequency higher than a frequency of a first radio frequency power in the first radio frequency power supply.

Here, in the plasma processing apparatus in FIG. 1, the filter 110 is connected to the first integrator 111 and the second integrator 112, and then an output is switched under control of a control device 115, and on the other hand, in the plasma processing apparatus in FIG. 2, a connection between the filter 110 and the first integrator 111 or the second integrator 112 is switched by a switch under the control of the control device 115.

The filter 110 in this case has a function (for example, high pass filter) of not allowing an output from a power supply other than the first bias power supply 113, including a power supply (not shown) (for example, a power supply of an electrostatic adsorption device for holding the wafer connected to the sample stage 109, and a power supply of a heater for performing temperature control of the wafer), to pass to a first bias power supply 113 side during output of the first bias power supply 113, and a function (for example, low pass filter) of not allowing an output from a power supply other than the second bias power supply 114, including a power supply (not shown) (for example, the power supply of the electrostatic adsorption device for holding the wafer connected to the sample stage 109, and the power supply of the heater for performing the temperature control of the wafer), to pass to a second bias power supply 114 side during output of the second bias power supply 114. While a radio frequency power of one of the first bias power supply 113 and the second bias power supply 114 is supplied, supply of the radio frequency power of the other one of the first bias power supply 113 and the second bias power supply 114 is stopped. The plasma power supply 105, the first bias power supply 113, and the second bias power supply 114 are connected to the control device 115, and output control of power supplies described later is performed by the control device 115.

In the plasma processing apparatus configured as described above, the processing gas supplied into the vacuum container 101 is converted into plasma by an action (for example, electron cyclotron resonance (ECR)) of an electric field of the microwave introduced via the ceiling plate 102 and a magnetic field formed by the solenoid coil 106, and the plasma is formed in a space between the shower plate 108 and the sample stage 109.

The sample stage 109 is applied with the radio frequency power having a frequency of 400 KHz from the first bias power supply 113 or with the radio frequency power having a frequency of 800 KHz from the second bias power supply 114. The radio frequency power applied to the sample stage 109 is controlled independently of a generation of the plasma, and generates a bias voltage for causing ions in the plasma to be incident on the wafer. The frequency of the radio frequency power applied to the sample stage 109 is referred to as a bias frequency condition. A pressure in the chamber set by a vacuum pump 116 (pressure adjusting device) via the control device 115 is referred to as a pressure condition.

Figure 4A:
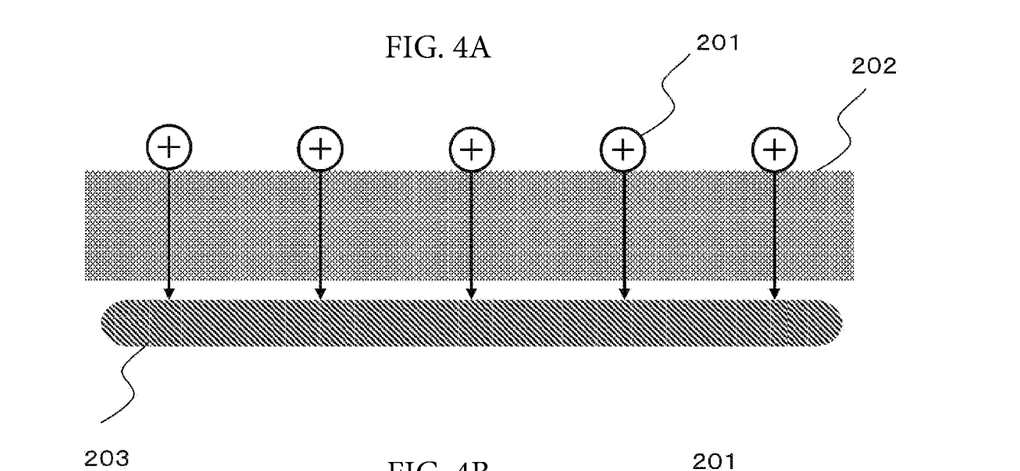
FIGS. 4A-4C show schematic diagrams showing a basis for determining ranges of a pressure condition and a frequency condition used in the embodiment of the invention.
Figure 4B:
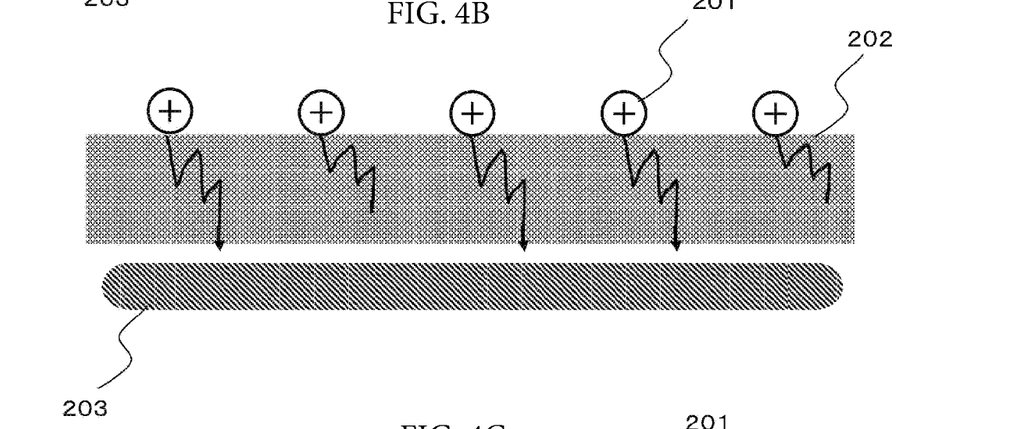
Figure 4C:
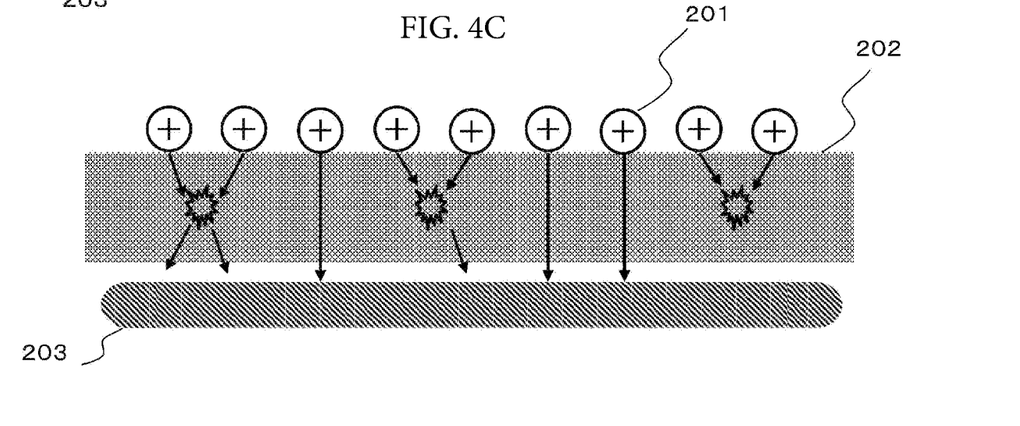

With reference to FIGS. 4A-4C, a difference in motion states of ions depending on the pressure condition and the bias frequency condition (hereinafter, referred to as a frequency condition) in the chamber to be used will be described. FIGS. 4A-4C shows a motion state of ions when the frequency condition and the pressure condition determined in the present embodiment are satisfied. FIG. 4B shows a motion state of ions when a frequency higher than the frequency condition is selected. FIG. 4C shows a motion state of ions when a pressure higher than the pressure condition is selected. The frequency condition and the pressure condition are shown below.

The frequency condition is determined as follows. Here, a boundary layer formed between the plasma and the wafer is referred to as a sheath. Although ions 201 pass through a sheath 202 and reach a wafer 203 by an electric field force generated by the bias power, when a period time of a positive and negative change of the bias power is faster than a time for the ions passing through the sheath, a time during which the ions stay in the sheath 202 is long, and a deviation of ion energy is large. When the deviation of the ion energy is large, an incident angle distribution of the ions is wide, and therefore it is difficult to obtain a vertical etching shape. Therefore, in the present embodiment, a frequency condition having a period longer than the time during which the ions 201 pass through the sheath 202 is used. That is, a frequency of the first radio frequency power and a frequency of the second radio frequency power are preferably values defined based on the time during which the ions pass through the sheath, and more preferably values equal to or less than an inverse number of the time during which the ions pass through the sheath.

The pressure condition in the chamber is determined as follows. The pressure condition used in the present embodiment is set such that an mean free path of the ions 201 contained in the plasma exceeds a thickness of the sheath 202 present directly above the wafer 203. By using the pressure condition, it is possible to ignore an influence of collision of the ions in the sheath 202 and to inhibit the deviation of the ion energy.

In the plasma processing apparatus used in the present embodiment, since an ion density is $1010\ cm^{-3}$ to $1011\ cm^{-3}$ and the bias voltage is 100 V to 400 V, the sheath thickness is considered to be about 0.4 mm to 4 mm, and therefore the pressure condition that can be used in the present embodiment is 2.66 Pa or less, and the frequency condition that can be used in the present embodiment is 3 MHz or less. An upper limit value of the frequency can be changed according to a gas type. A reason thereof will be described below.

Figure 5:
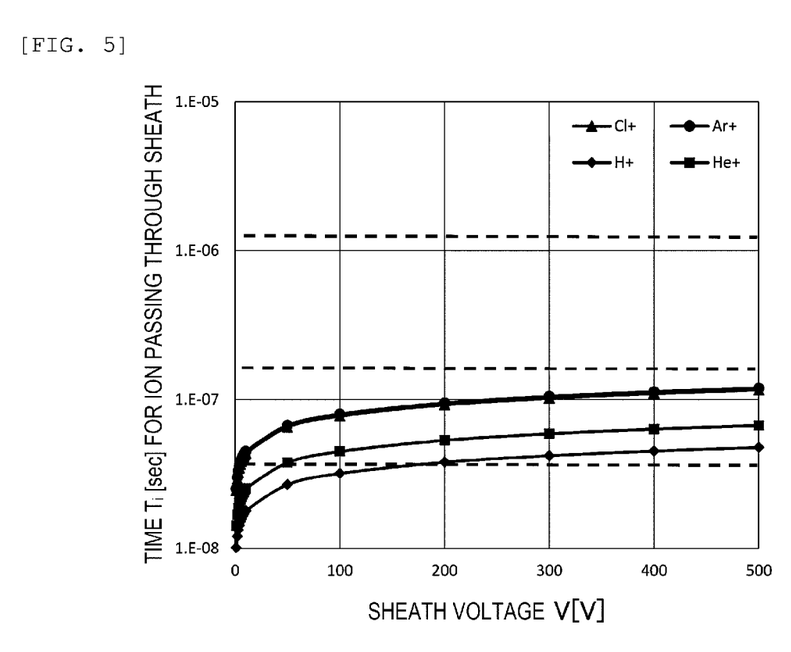
FIG. 5 is a graph showing a relationship between a time for an ion passing through a sheath and a sheath voltage.

FIG. 5 is a graph showing a relationship between a time for ion passing through the sheath and a sheath voltage. As shown in FIG. 5, the relationship between the time for ion passing through the sheath and the sheath voltage varies depending on the gas type used (for example, Ar, Cl, He, and H).

Here, when the sheath thickness is set to d, the sheath voltage is set to V, the time for ion passing through the sheath is set to Ti, a period of the bias power supply is set to TRE, an ion mass is set to mi, and an elementary charge is set to e, the following Equations 1 and 2 are established.

[Math. 1]

$$T_i = d \cdot \left(\frac{m_i}{2eV}\right)^{\frac{1}{2}} \quad \text{(Equation 1)}$$

[Math. 2]

$$d \propto V^{\frac{3}{4}} \quad \text{(Equation 2)}$$

According to the obtained frequency condition, since $T_i < T_{RF}/2$, the upper limit of the frequency is about 3 MHZ when a general gas type is used, and as is clear from FIG. 5, the upper limit of the frequency condition can be changed according to the gas type. Although FIG. 5 shows an example in which one type of gas is used, the graph changes according to a mixing ratio when a mixed gas is used.

In the present embodiment, the frequency of the bias power is 400 KHz and 800 KHz, and the pressure of the chamber is 4.8 mTorr so as to satisfy the frequency condition and the pressure condition described above.

Figure 6:
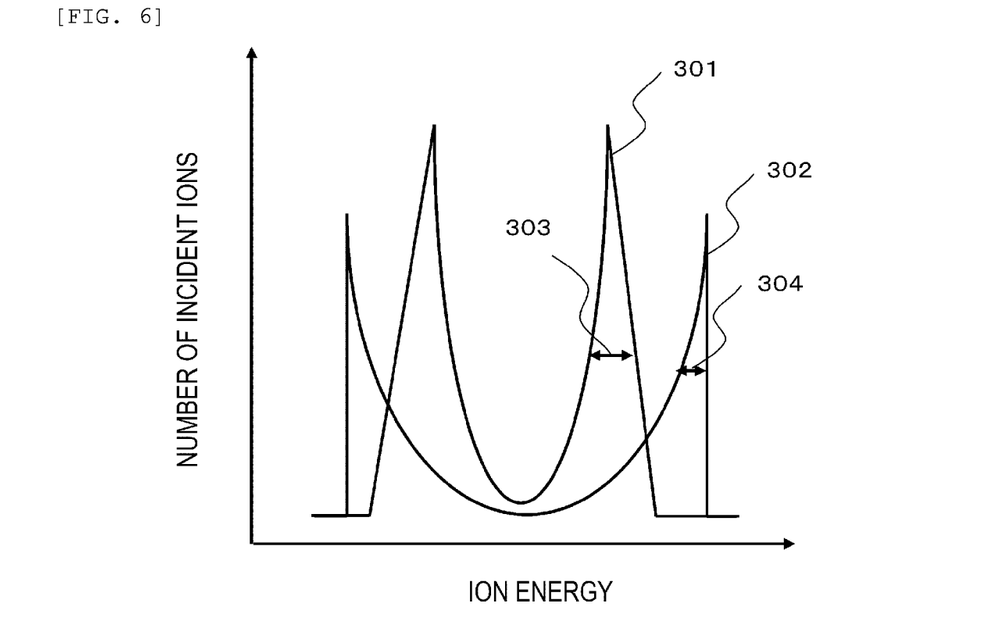
FIG. 6 is a schematic diagram of an ion energy distribution function of a bias power in the ranges of the pressure condition and the frequency condition determined in FIGS. 4A-4C.

In FIG. 6, a horizontal axis shows energy of the ions incident on the wafer, and a vertical axis shows a flux of ions having the energy incident on the wafer. Here, ion energy distributions at different bias power frequencies are compared and shown. It can be seen that, an ion energy distribution 301 at 13.56 MHz and an ion energy distribution 302 at 400 KHz or 800 KHz have different peaks and have different ion energy, and, for peak full width at half maximums (303 and 304), the peak full width at half maximum of the ion energy distribution 301 is wider and the deviation of the ion energy of the ion energy distribution 301 is larger. Therefore, similar to the high pressure condition described above, since the incident angle distribution of the ions is wide, it is difficult to obtain a vertical etching shape.

(Etching Evaluation)

Figure 7A:
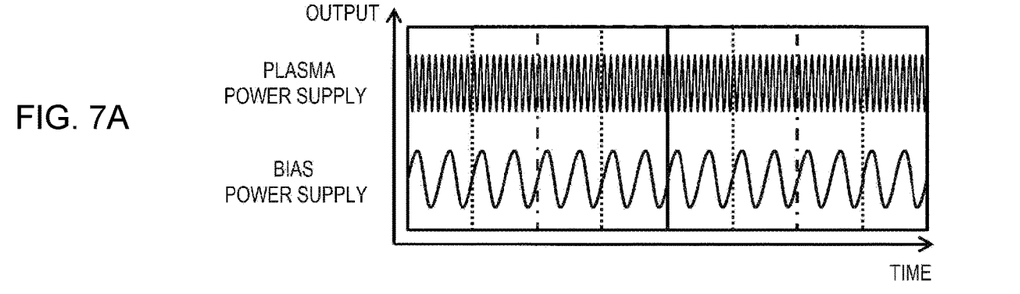
FIGS. 7A-7C show waveform diagrams showing output states of a plasma generating radio frequency power supply and a bias radio frequency power supply in the plasma processing apparatus in FIG. 2.
Figure 7B:
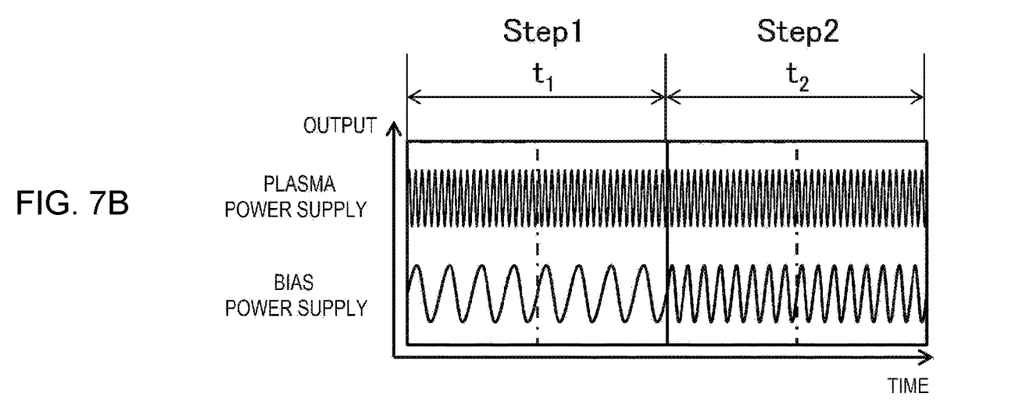
Figure 7C:
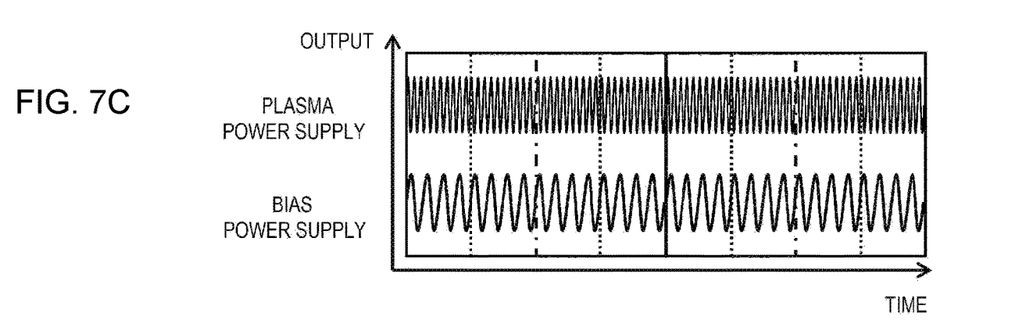
Figure 8:
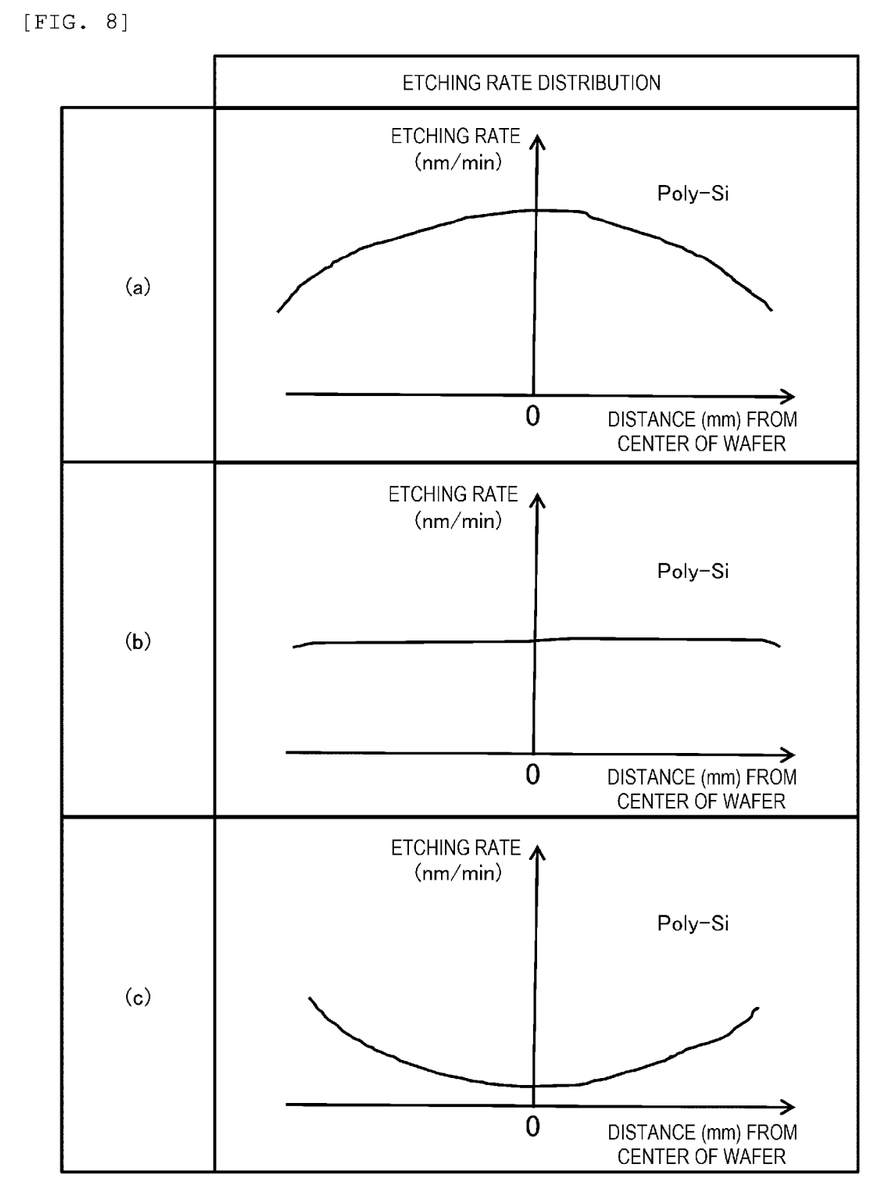
FIG. 8 is a diagram showing an etching rate in each output state when a wafer is etched by using outputs of the plasma generating radio frequency power supply and the bias radio frequency power supply in the plasma processing apparatus in FIGS. 7A-7C, in which a horizontal axis represents a distance from a center of the wafer and a vertical axis represents the etching rate.

The etching evaluation performed by the present inventors will be described below. Etching rate distributions as shown in FIG. 8 are obtained by an etching processing in which the first radio frequency power having a low frequency (400 KHz) and the second radio frequency power having a higher frequency (800 KHz), whose outputs are controlled as shown in FIGS. 7A-7C, are switched and supplied. A target of the etching processing in this case is a film structure shown in (a) of FIG. 3, that is, a wafer in which the SiO$_2$ film 24 is laminated on the Si substrate 23.

As etching conditions, a mixed gas of Cl$_2$ and Ar was used as the processing gas, a total gas flow rate was set to 250 ml/min, the pressure was set to 4.8 mTorr, an output of the plasma power supply 105 was set to 700 W, and the outputs of the first bias power supply 113 and the second bias power supply 114 were set to 150 W, respectively. The etching processing was evaluated by an etching rate on a Poly-Si film.

An output ratio of the first bias power supply 113 to the second bias power supply 114 during the etching was adjusted by a step time as shown in FIGS. 7A-7C. Such adjustment can be performed by the control device 115.

(a) of FIG. 8 shows an etching rate distribution corresponding to the output control in FIG. 7A. When only the output of the first bias power supply having a lower frequency is used as shown in FIG. 7A, the etching rate distribution is a middle-high distribution in which the etching rate is high at the center of the wafer and the etching rate is low at outer peripheries as shown in (a) of FIG. 8.

(b) of FIG. 8 shows an etching rate distribution corresponding to the output control in FIG. 7B. As shown in FIG. 7B, when the output of the low frequency and the output of the high frequency are alternately output from the first and second bias power supplies at the same time, the etching rate distribution is substantially uniform in a plane as shown in (b) of FIG. 8.

(c) of FIG. 8 shows an etching rate distribution corresponding to the output control in FIG. 7C. When only the output of the second bias power supply having a higher frequency is used as shown in FIG. 7C, the etching rate distribution is an outer-high distribution in which the etching rate is low at the center of the wafer and the etching rate is high at the outer peripheries as shown in (c) of FIG. 8.

In this way, it is found that, as a ratio of a supply time of the radio frequency power having a high frequency (800 KHz) to a supply time of the radio frequency power having a low frequency (400 KHz) is gradually increased, the etching rate of an outer peripheral portion of the wafer is increased, and therefore the etching rate distribution in the plane of the wafer can be controlled.

A reason why the etching rate of the outer peripheral portion of the wafer increases as the ratio of the supply time of the radio frequency power having a high frequency increases, in other words, as the ratio of the supply time of the radio frequency power having a low frequency decreases, is considered as follows.

The plasma processing apparatus used in the present embodiment is a plasma processing apparatus using an interaction between the electric field of the microwave and the magnetic field generated by the solenoid coil. In such a plasma processing apparatus, when a current flows between the sample stage 109 and the grounded vacuum container 101 via the plasma generated by the radio frequency power for bias applied to the sample stage 109, electrons in the plasma cross the magnetic field formed in the vacuum container 101.

Figure 9:
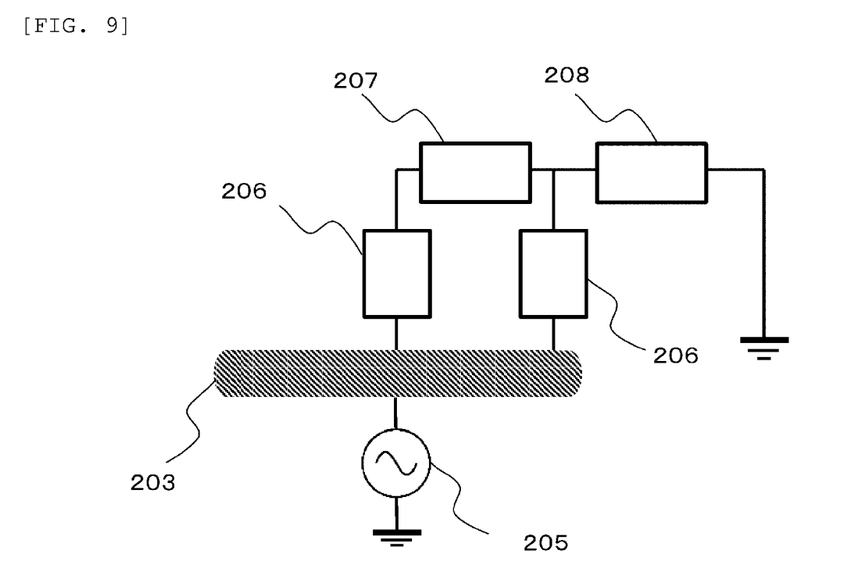
FIG. 9 is a schematic diagram showing a plasma impedance during plasma etching.

At the time, the magnetic field tries to capture the electrons, which is expressed as a cross field impedance of the plasma. In FIG. 9, when a cross field impedance 207 from a central portion of the wafer 203 to an end portion of the wafer 203 is set to Z1 and a cross field impedance 208 from the end portion of the wafer 203 to the ground is set to Z2, the cross field impedance viewed from the central portion of the wafer 203 is (Z1+Z2), and the cross field impedance viewed from the end portion of the wafer is only Z2. A sheath impedance 206 received from the sheath directly above the wafer 203 is referred to as ZS. Since the sheath impedance ZS is equal in the plane of the wafer 203, the plasma impedance seen from the central portion of the wafer 203 is (ZS+Z1+Z2), and the plasma impedance seen from the end portion of the wafer 203 is (ZS+Z2).

Here, the sheath impedance has an inverse correlation with the frequency of the radio frequency power, and the sheath impedance decreases as the frequency increases. Therefore, in the radio frequency power having a high frequency, the sheath impedance is negligibly small as compared with the cross field impedance, and therefore the plasma impedance at the central portion of the wafer 203 can be approximated to (Z1+Z2), and the plasma impedance at the end portion of the wafer 203 can be approximated to Z2. Therefore, since the plasma impedance at the end portion of the wafer 203 is lower than that of the central portion of the wafer 203, the ion energy from the plasma incident on the wafer 203 by the application of the bias voltage is increased at the end portion of the wafer 203 as compared with the central portion of the wafer 203, and therefore the etching rate on the end portion of the wafer 203 is higher than that of the central portion.

In contrast, in the radio frequency power having a low frequency, the sheath impedance is increased and the cross field impedance is negligible relative to the sheath impedance, and therefore, both the plasma impedances at the end portion and the central portion of the wafer 203 can be approximated to ZS. Therefore, since a difference in the plasma impedances in the plane of the wafer 203 is reduced, there is no difference in the ion incident energy from the plasma in the plane of the wafer 203.

According to characteristics of the plasma processing apparatus used in the present embodiment, the gas in the vacuum container 101 flows from the upper portion to the lower portion of the vacuum container 101 via a peripheral space of the sample stage 109 and is exhausted. Therefore, since the number of active species from the plasma supplied to the periphery of the wafer 203 is smaller than that to the central portion of the wafer, the etching rate around the wafer decreases and the etching rate distribution has a high etching rate at the center. Therefore, it can be said that the etching rate distribution which has a high etching rate at the center is due to the characteristics of the plasma processing apparatus according to the present embodiment.

As described above, according to the present embodiment, by changing the ratio of the output time of the radio frequency power having a low frequency (400 KHz) to the output time of the radio frequency power having a high frequency (800 KHz), the etching rate distribution can be adjusted between the distribution which has a high etching rate at the center and a distribution which has a high etching rate in the peripheral, and, during the time, as shown in (b) of FIG. 8, by setting the conditions under which the etching rate distribution is substantially uniform, that is, the ratio of the output time of the radio frequency power having a low frequency to the output time of the radio frequency power having a high frequency, it is possible to achieve uniformity of the etching rate in the plane of the wafer.

Figure 10:
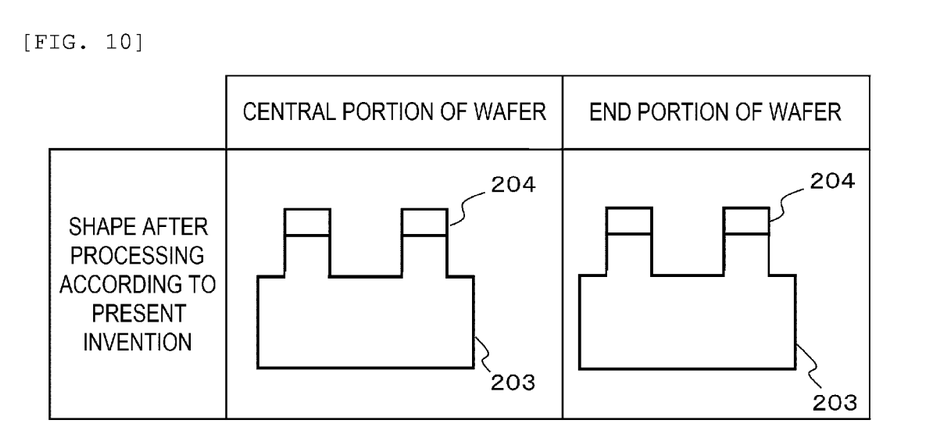
FIG. 10 is a diagram showing an etching shape when the wafer is etched by using the present embodiment.

FIG. 10 shows an etching shape when the etching processing is performed under the conditions that the etching rate is uniform as shown in (b) of FIG. 8. Here, similar to that in FIG. 3, the $SiO_2$ film 204 formed on a mask 203 of the Si substrate is etched. By using the combination of the radio frequency powers of 400 KHz and 800 KHz used in the present embodiment, the etching processing is performed under the conditions where the etching rate is uniform as shown in (b) of FIG. 8. As a result, as shown in FIG. 10, the etching shape is a vertical shape in both the central portion of the wafer and the end portion of the wafer, and shape depths are the same at the central portion of the wafer and the end portion of the wafer.

In the example in which the etching processing is performed according to the related art (see (c) of FIG. 3), there is a difference in the etching shape between the central portion of the wafer and the end portion of the wafer. A reason for this is considered to be that a difference occurs in a full width at half maximum of an energy peak value of the ion energy distribution depending on the frequencies of the two kinds of different bias powers. That is, it is considered that, as shown in FIG. 6, when using a combination in which the full width at half maximum of the energy peak value of the ion energy distribution generated by the bias power having a low frequency (400 KHz) is different from the full width at half maximum of the energy peak value of the ion energy distribution generated by the bias power having a high frequency (13.56 MHZ), under a condition that the time is adjusted such that the etching rate is uniform, the shape depth is uniform at the central portion of the wafer and the end portion of the wafer, but the etching shape is not uniform during the etching.

In contrast, it is considered that, when the combination of the bias power having a low frequency (400 KHz) and the bias power having a high frequency (800 KHz) used in the present embodiment is used, since the full width at half maximums of the energy peak values of the ion energy distributions generated by the respective frequencies are equal to each other, under the condition that the time is adjusted such that the etching rate is uniform, the shape depth and the etching shape during the etching are uniform at the central portion of the wafer and the end portion of the wafer.

In this way, by adopting a configuration in which the output of the bias power having a low frequency and the output of the bias power having a high frequency are alternately switched and the ratio of the output time of the respective power can be controlled, it is possible to further improve the controllability of the ions incidence on the wafer.

Although in the present embodiment, the radio frequency powers having two different frequencies are supplied to the sample stage 109, when the radio frequency power is supplied from one bias power supply, the supply of the radio frequency power from the other bias power supply is stopped, and therefore the current does not flow into the sample stage 109 from the other bias power supply. Therefore, an occurrence of crosstalk can be prevented, and the bias power can be stably supplied to the sample stage 109.

In the present embodiment, a combination of a radio frequency power supply of 400 KHz and a radio frequency power supply of 800 KHz is used as a combination of bias power supplies having a pressure of 0.638 Pa and two different frequencies during plasma processing. However, when the pressure condition and the frequency condition are satisfied, it is preferable to select a combination of frequencies at which a difference in sheath impedance is large. In other words, the frequency of the first radio frequency power and the frequency of the second radio frequency power are defined based on the sheath impedance on the sample, and are preferably frequencies at which the difference in the sheath impedance at the frequency of the first radio frequency power and the sheath impedance at the frequency of the second radio frequency power is large, for example. Either the switching of the radio frequency power having a low frequency or a high frequency may be performed first.

As described above, according to the present embodiment, the etching rate distribution in the plane of the wafer can be controlled and the etching rate uniformity in the plane of the wafer can be controlled by changing the ratio of the output time of the first bias power supply to the second bias power supply and applying the power to the sample stage. Since the frequency is selected in consideration of the ion energy distribution, it is also possible to control the distribution of the etching shape in the plane of the wafer.

In the example described above, although the combination of the pressure and the frequency of the bias power to be used is optionally designated, the sheath thickness can be roughly estimated according to the bias voltage, and therefore, if the pressure is designated, the frequency condition of the bias power that can be used is determined. Therefore, when the frequency condition of the bias power that can be automatically used is indicated by specifying the pressure, the control of the ions is simpler.

Although microwave ECR plasma has been described as an example in the embodiment described above, similar effects as those of the present embodiment can also be obtained in a plasma processing apparatus in another plasma generation system such as capacitively coupled plasma or inductively coupled plasma.

The embodiment described above has been described in detail for easy understanding of the invention, and is not necessarily limited to those having all the described configurations. A part of configurations of an embodiment may be replaced with configurations of another embodiment, or the configurations of another embodiment may be added to the configurations of the embodiment. A part of the configuration of each embodiment can be added, deleted, or replaced with another configuration.

REFERENCE SIGN LIST

101: vacuum container
102: ceiling plate
103: waveguide tube
104: integrator
105: plasma power supply
106: solenoid coil
107: gas supply device
108: shower plate
109: sample stage
110: filter
111: first integrator
112: second integrator
113: first bias power supply
114: second bias power supply
115: control device
116: vacuum pump
201: ion
202: sheath
203: wafer
204: SiO$_2$ film
205: bias power supply
206: sheath impedance
207: cross field impedance from center to end of electrode
208: cross field impedance from end of electrode to ground
301: ion energy distribution at 13.56 MHz of bias power frequency
302: ion energy distribution at 400 KHz or 800 KHz of bias power frequency
303: peak full width at half maximum of energy peak value at high energy side of ion energy distribution at 13.56 MHz of bias power frequency
304: peak full width at half maximum of energy peak value at high energy side of ion energy distribution at 400 KHz or 800 KHz of bias power frequency

The invention claimed is:

1. A plasma processing apparatus comprising:
a processing chamber in which a sample is plasma-processed;
a radio frequency power supply configured to supply a radio frequency power for generating plasma;
a first radio frequency power supply configured to supply, to a sample stage on which the sample is placed, a first radio frequency power;
a second radio frequency power supply configured to supply, to the sample stage, a second radio frequency power having a frequency higher than a frequency of the first radio frequency power; and
a control device configured to control the first radio frequency power supply and the second radio frequency power supply such that the supply of one radio frequency power is stopped while the other radio frequency power is supplied, wherein
the frequency of the first radio frequency power and the frequency of the second radio frequency power are defined based on a full width at half maximum of a peak value of an ion energy distribution with respect to the frequency.

2. The plasma processing apparatus according to claim 1, wherein
the frequency of the second radio frequency power is a frequency at which the full width at half maximum is the same as the full width at half maximum at the frequency of the first radio frequency power.

3. The plasma processing apparatus according to claim 2, wherein
the frequency of the first radio frequency power and the frequency of the second radio frequency power are defined based on an impedance of a sheath on the sample.

4. The plasma processing apparatus according to claim 3, wherein
the frequency of the first radio frequency power and the frequency of the second radio frequency power are frequencies at which a difference in the sheath impedance at the frequency of the first radio frequency power and the sheath impedance at the frequency of the second radio frequency power is large.

5. The plasma processing apparatus according to claim 4, wherein
the frequency of the first radio frequency power and the frequency of the second radio frequency power are values defined based on a time during which an ion passes through the sheath.

6. The plasma processing apparatus according to claim 5, wherein
the frequency of the first radio frequency power and the frequency of the second radio frequency power are values equal to or less than an inverse number of the time during which the ion passes through the sheath.

7. The plasma processing apparatus according to claim 6, wherein
the frequency of the second radio frequency power is 3 MHz or less.

8. A plasma processing method, which uses a plasma processing apparatus including a processing chamber in which a sample is plasma-processed, a radio frequency power supply configured to supply a radio frequency power for generating plasma, a first radio frequency power supply configured to supply, to a sample stage on which the sample is placed, a first radio frequency power, and a second radio frequency power supply configured to supply, to the sample stage, a second radio frequency power having a frequency higher than a frequency of the first radio frequency power, the plasma processing method comprising:
controlling the first radio frequency power supply and the second radio frequency power supply such that the supply of one radio frequency power is stopped while the other radio frequency power is supplied;

setting a pressure in the plasma processing to a pressure at which a mean free path of an ion is longer than a sheath thickness on the sample;

defining the frequency of the first radio frequency power and the frequency of the second radio frequency power based on a -full width at half maximum of a peak value of an ion energy distribution with respect to the frequency; and etching the sample based on the control of the first and second radio frequency power supplying or stopping in the step of controlling the first radio frequency power supply and the second radio frequency power supply, the plasma processing pressure set in the step of setting the pressure, and the frequency of the first radio frequency power and the frequency of the second radio frequency power defined in the step of defining the frequency of the first radio frequency power and the frequency of the second radio frequency power.

9. The plasma processing method according to claim 8, further comprising:

setting the frequency of the second radio frequency power to a frequency at which the -full width at half maximum is the same as the -full width at half maximum at the frequency of the first radio frequency power.

10. The plasma processing method according to claim 9, further comprising:

setting the frequency of the first radio frequency power and the frequency of the second radio frequency power to a value equal to or less than an inverse number of a time during which the ion passes through the sheath on the sample.

11. The plasma processing method according to claim 10, further comprising:

setting the pressure in the plasma processing to 2.66 Pa or less.

\* \* \* \* \*